United States Patent
Williamson et al.

(10) Patent No.: US 8,821,682 B2
(45) Date of Patent: Sep. 2, 2014

(54) ELECTRON INDUCED CHEMICAL ETCHING AND DEPOSITION FOR LOCAL CIRCUIT REPAIR

(75) Inventors: Mark J. Williamson, Boise, ID (US);
Gurtej S. Sandhu, Boise, ID (US);
Justin R. Arrington, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 12/896,549

(22) Filed: Oct. 1, 2010

(65) Prior Publication Data
US 2011/0017401 A1 Jan. 27, 2011

Related U.S. Application Data

(62) Division of application No. 11/483,933, filed on Jul. 10, 2006, now Pat. No. 7,807,062.

(51) Int. Cl.
*C23F 1/00* (2006.01)
*C23C 16/00* (2006.01)

(52) U.S. Cl.
USPC ............ 156/345.24; 156/345.25; 156/345.38; 700/121; 216/37

(58) Field of Classification Search
USPC ........ 156/345.25, 345.24; 438/689, 692, 710, 438/8, 3; 216/37, 58, 62, 104
See application file for complete search history.

(56) References Cited

U.S. PATENT DOCUMENTS

| | | | |
|---|---|---|---|
| 4,260,649 A | 4/1981 | Dension et al. | |
| 4,543,486 A | 9/1985 | Rose | |
| 4,579,750 A | 4/1986 | Bowen et al. | |
| 4,581,248 A | 4/1986 | Roche | |

(Continued)

FOREIGN PATENT DOCUMENTS

| | | |
|---|---|---|
| EP | 0756318 A1 | 1/1997 |
| EP | 1363164 A1 | 11/2003 |

(Continued)

OTHER PUBLICATIONS

Abramo, M., et al., "Gas Assisted Etching: An Advanced Technique for Focused Ion Beam Device Modification", Proceedings of the International Symposium for Testing Failure Analysis, (Nov. 13, 1994), 439-446 pgs.

(Continued)

*Primary Examiner* — Gordon R Baldwin
*Assistant Examiner* — Charlee Bennett
(74) *Attorney, Agent, or Firm* — Schwegman Lundberg & Woessner, P.A.

(57) ABSTRACT

Systems and methods of imaging and repairing defects on and below the surface of an integrated circuit (IC) are described. The method may be used in areas as small as one micron in diameter, and may remove the topmost material in the small spot, repeating with various layers, until a desired depth is obtained. An energetic beam, such as an electron beam, is directed at a selected surface location. The surface has an added layer of a solid, fluid or gaseous reactive material, such as a directed stream of a fluorocarbon, and the energetic beam disassociates the reactive material in the region of the beam into radicals that chemically attack the surface. After the defect location is exposed, the method uses the energetic beam to etch undesired materials, and deposit various appropriate materials to fill gaps, and restore the IC to an operational condition.

20 Claims, 7 Drawing Sheets

(56) References Cited

U.S. PATENT DOCUMENTS

| | | |
|---|---|---|
| 4,624,736 A | 11/1986 | Gee et al. |
| 4,655,849 A | 4/1987 | Schachameyer et al. |
| 4,668,304 A | 5/1987 | Schachameyer et al. |
| 4,670,063 A | 6/1987 | Schachameyer et al. |
| 4,670,064 A | 6/1987 | Schachameyer et al. |
| 4,685,976 A | 8/1987 | Schachameyer et al. |
| 4,694,777 A | 9/1987 | Roche |
| 4,735,822 A | 4/1988 | Ohtoshi et al. |
| 4,832,781 A | 5/1989 | Mears |
| 4,933,206 A | 6/1990 | Cox |
| 4,938,996 A | 7/1990 | Ziv et al. |
| 4,940,505 A | 7/1990 | Schachameyer et al. |
| 4,980,198 A | 12/1990 | Dowben et al. |
| 5,032,435 A | 7/1991 | Biefeld et al. |
| 5,047,649 A | 9/1991 | Hodgson et al. |
| 5,102,830 A | 4/1992 | Sandhu |
| 5,140,164 A | 8/1992 | Talbot et al. |
| 5,155,053 A | 10/1992 | Atkinson |
| 5,164,222 A | 11/1992 | Gottsleben et al. |
| 5,326,981 A | 7/1994 | Hara et al. |
| 5,356,514 A | 10/1994 | Kinoshita |
| 5,387,443 A | 2/1995 | Ota et al. |
| 5,403,433 A | 4/1995 | Morrison et al. |
| 5,419,822 A | 5/1995 | Dakesian et al. |
| 5,429,730 A | 7/1995 | Nakamura et al. |
| 5,438,019 A | 8/1995 | Sandhu |
| 5,472,935 A | 12/1995 | Yandrofski et al. |
| 5,508,368 A | 4/1996 | Knapp et al. |
| 5,581,874 A * | 12/1996 | Aoki et al. ............ 29/825 |
| 5,622,567 A | 4/1997 | Kojima et al. |
| 5,639,342 A | 6/1997 | Chen et al. |
| 5,641,545 A | 6/1997 | Sandhu |
| 5,648,114 A | 7/1997 | Paz De Araujo et al. |
| 5,682,041 A | 10/1997 | Kawakubo et al. |
| 5,733,609 A | 3/1998 | Wang |
| 5,754,297 A | 5/1998 | Nulman |
| 5,759,923 A | 6/1998 | McMillan et al. |
| 5,800,617 A | 9/1998 | Sandhu |
| 5,807,650 A | 9/1998 | Komano et al. |
| 5,825,035 A | 10/1998 | Mizumura et al. |
| 5,834,331 A | 11/1998 | Razeghi |
| 5,942,854 A | 8/1999 | Ryoji et al. |
| 5,976,328 A | 11/1999 | Azuma et al. |
| 5,985,693 A | 11/1999 | Leedy |
| 5,989,928 A | 11/1999 | Nakata et al. |
| 6,051,287 A | 4/2000 | Marsh |
| 6,064,800 A | 5/2000 | Sandhu |
| 6,091,071 A | 7/2000 | Franz et al. |
| 6,113,751 A | 9/2000 | Morgenthaler |
| 6,143,085 A | 11/2000 | Marsh |
| 6,165,334 A | 12/2000 | Watanabe |
| 6,177,147 B1 | 1/2001 | Samukawa et al. |
| 6,187,492 B1 | 2/2001 | Ri et al. |
| 6,194,325 B1 | 2/2001 | Yang et al. |
| 6,214,183 B1 | 4/2001 | Maishev et al. |
| 6,281,072 B1 | 8/2001 | Li et al. |
| 6,291,341 B1 | 9/2001 | Sharan et al. |
| 6,309,972 B1 | 10/2001 | Pio |
| 6,310,341 B1 | 10/2001 | Todokoro et al. |
| 6,462,333 B1 | 10/2002 | Gersonde |
| 6,492,068 B1 | 12/2002 | Suzuki |
| 6,499,425 B1 | 12/2002 | Sandhu et al. |
| 6,573,199 B2 | 6/2003 | Sandhu et al. |
| 6,613,702 B2 | 9/2003 | Sandhu et al. |
| 6,661,005 B1 | 12/2003 | Bruenger |
| 6,683,005 B2 | 1/2004 | Sandhu et al. |
| 6,720,272 B2 | 4/2004 | Sandhu et al. |
| 6,730,367 B2 | 5/2004 | Sandhu |
| 6,753,538 B2 * | 6/2004 | Musil et al. ............ 250/492.2 |
| 6,764,856 B2 | 7/2004 | Holmes et al. |
| 6,787,783 B2 * | 9/2004 | Marchman et al. ...... 250/492.2 |
| 6,793,736 B2 | 9/2004 | Sandhu et al. |
| 6,797,337 B2 | 9/2004 | Dando et al. |
| 6,809,317 B2 | 10/2004 | Vandervorst |
| 6,811,615 B2 | 11/2004 | Sun |
| 6,838,114 B2 | 1/2005 | Carpenter et al. |
| 6,838,121 B2 | 1/2005 | Weimer |
| 6,845,734 B2 | 1/2005 | Carpenter et al. |
| 6,869,479 B2 | 3/2005 | Shafeev et al. |
| 6,897,907 B2 | 5/2005 | Morimitsu |
| 6,911,832 B2 | 6/2005 | Kolachina et al. |
| 6,927,173 B2 | 8/2005 | Mori et al. |
| 7,012,266 B2 | 3/2006 | Jin |
| 7,113,276 B1 | 9/2006 | Higgs et al. |
| 7,122,125 B2 | 10/2006 | Deshmukh et al. |
| 7,238,294 B2 | 7/2007 | Koops et al. |
| 7,256,405 B2 | 8/2007 | Nakasuji et al. |
| 7,262,555 B2 | 8/2007 | Rueger et al. |
| 7,303,690 B2 | 12/2007 | Amemiya et al. |
| 7,311,947 B2 | 12/2007 | Dando et al. |
| 7,452,477 B2 | 11/2008 | Koops et al. |
| 7,569,484 B2 | 8/2009 | Rueger et al. |
| 7,662,648 B2 | 2/2010 | Sandhu |
| 7,718,080 B2 | 5/2010 | Rueger et al. |
| 7,791,055 B2 | 9/2010 | Williamson et al. |
| 7,791,071 B2 | 9/2010 | Rueger et al. |
| 7,807,062 B2 | 10/2010 | Williamson et al. |
| 7,833,427 B2 | 11/2010 | Rueger et al. |
| 7,892,978 B2 | 2/2011 | Williamson et al. |
| 8,026,501 B2 | 9/2011 | Williamson et al. |
| 8,389,415 B2 | 3/2013 | Rueger et al. |
| 8,414,787 B2 | 4/2013 | Rueger et al. |
| 2002/0173124 A1 | 11/2002 | Joo |
| 2002/0182542 A1 | 12/2002 | Choi et al. |
| 2003/0047691 A1 | 3/2003 | Musil et al. |
| 2003/0170389 A1 | 9/2003 | Sandhu |
| 2003/0201391 A1 | 10/2003 | Shinada et al. |
| 2004/0036398 A1 | 2/2004 | Jin |
| 2004/0043621 A1 | 3/2004 | Nasser-Ghodsi |
| 2004/0048398 A1 | 3/2004 | Liang et al. |
| 2004/0091638 A1 | 5/2004 | Haight et al. |
| 2004/0097076 A1 | 5/2004 | Iyer et al. |
| 2004/0113097 A1 | 6/2004 | Marchman et al. |
| 2004/0124348 A1 | 7/2004 | Utz et al. |
| 2004/0140437 A1 | 7/2004 | Bukofsky et al. |
| 2004/0151991 A1 | 8/2004 | Stewart et al. |
| 2004/0169963 A1 | 9/2004 | Okuno et al. |
| 2005/0072753 A1 * | 4/2005 | Koops et al. ............ 216/2 |
| 2005/0078462 A1 | 4/2005 | Dando et al. |
| 2005/0087514 A1 | 4/2005 | Koops et al. |
| 2005/0139291 A1 | 6/2005 | Taira et al. |
| 2005/0212092 A1 | 9/2005 | Nishizawa |
| 2005/0253093 A1 | 11/2005 | Gorski et al. |
| 2005/0266168 A1 | 12/2005 | Poullos |
| 2006/0094132 A1 | 5/2006 | Liu et al. |
| 2006/0134920 A1 | 6/2006 | Liang |
| 2006/0147814 A1 | 7/2006 | Liang |
| 2006/0154477 A1 | 7/2006 | Geng et al. |
| 2006/0183055 A1 | 8/2006 | O'Neill et al. |
| 2006/0201911 A1 | 9/2006 | Edelberg et al. |
| 2006/0228634 A1 | 10/2006 | Bret et al. |
| 2006/0255260 A1 * | 11/2006 | Ludviksson ............ 250/288 |
| 2006/0276056 A1 | 12/2006 | Ward et al. |
| 2006/0288937 A1 | 12/2006 | Dando et al. |
| 2006/0289969 A1 | 12/2006 | Dando et al. |
| 2007/0015371 A1 | 1/2007 | Olynick et al. |
| 2007/0158303 A1 | 7/2007 | Nasser-Ghodsi et al. |
| 2007/0158304 A1 | 7/2007 | Nasser-Ghodsi et al. |
| 2007/0228002 A1 | 10/2007 | Geng et al. |
| 2007/0228296 A1 | 10/2007 | Mouttet |
| 2007/0257212 A1 | 11/2007 | Mouttet |
| 2007/0264831 A1 | 11/2007 | Yu et al. |
| 2007/0278180 A1 | 12/2007 | Williamson et al. |
| 2008/0006603 A1 | 1/2008 | Williamson et al. |
| 2008/0006786 A1 | 1/2008 | Williamson et al. |
| 2008/0009140 A1 | 1/2008 | Williamson et al. |
| 2008/0038863 A1 | 2/2008 | Rueger et al. |
| 2008/0038894 A1 | 2/2008 | Rueger et al. |
| 2008/0038928 A1 | 2/2008 | Rueger et al. |
| 2008/0038933 A1 | 2/2008 | Rueger et al. |
| 2009/0288603 A1 | 11/2009 | Rueger et al. |
| 2010/0221922 A1 | 9/2010 | Rueger et al. |
| 2010/0314354 A1 | 12/2010 | Rueger et al. |

(56) References Cited

U.S. PATENT DOCUMENTS

| | | |
|---|---|---|
| 2010/0320384 A1 | 12/2010 | Williamson et al. |
| 2011/0056625 A1 | 3/2011 | Rueger et al. |
| 2011/0139368 A1 | 6/2011 | Williamson et al. |

FOREIGN PATENT DOCUMENTS

| | | |
|---|---|---|
| JP | 09064030 A2 | 3/1997 |
| JP | 2004-257845 | 9/2004 |
| TW | 359455 | 3/2012 |
| WO | WO-2008008156 A2 | 1/2008 |
| WO | WO-2008008156 A3 | 1/2008 |
| WO | WO-2008008157 A2 | 1/2008 |
| WO | WO-2008008157 A3 | 1/2008 |
| WO | WO-2008008159 A2 | 1/2008 |
| WO | WO-2008008159 A3 | 1/2008 |
| WO | WO-2008021363 A2 | 2/2008 |
| WO | WO-2008021363 A3 | 2/2008 |

OTHER PUBLICATIONS

Abramo, M. T, et al., "The application of advanced techniques for complex focused-ion-beam device modification", Reliability of electron devices, failure physics and analysis, 1996. Proceedings of the 7th european symposium on Oct. 8-11, 1996, Piscataway, NJ, USA, IEEE, (Oct. 8, 1996), 1775-1778 pgs.

Alers, G., et al., "Interlevel Dielectric Failure in Copper/Low-K Structures", IEEE, Transactions on Devices and Material Reliability 36, (2004), 148-152.

Fujii, Toshiaki, et al., "A nanofactory by focused ion beam", Journal of Micromechanics and Microengineering, 15(10), (2005), S286-S291.

Fujioka, H., et al., "Measurements of the Energy Dependence of Electron Beam Assisted Etching of, and Deposition on, Silica", Journal of Physics D. Applied Physics, IOP Publishing, Bristol, GB, vol. 23, No. 2, (Feb. 14, 1990), 266-268 pgs.

Golub, M., "Scanning electron microscope investigations of highly conducting organic composites", Journal of Material Sciences 36, (2001), 5543-5550.

Jonge, N., et al., "High brightness electron beam from a multi-walled carbon nanotube", Nature vol. 420, (Nov. 28, 2002), 393-395.

Liao, J. Y, et al., "Etch characterization of packaged IC samples in an RIE with endpoint detection by ICP source for failure analysis applications", Physical and failure analysis of integrated circuits, 2005, IPFA 2005. Proceedings of the 12th International Symposium on the Shangri-LA's RASA Sentosa Resort, Singapore Jun. 27-Jul. 1, 2005 Piscataway, NJ, USA, IEEE, (Jun. 27, 2005), 123-126 pgs.

Marcoux, P. J, et al., "Methods of end point detection for plasma etching", Solid State Technology, Pennwell Corporation, Tulsa, OK, US, vol. 25, (Apr. 1981), 115-122 pgs.

Numajiri, T., et al., "Sample Preparation for electron beam testing with reactive ion etching", Physical and Failure Analysis of Integrated circuits,1997, Proceedings of the 1997 6th International Symposium on Singapore Jul. 21-25, 1997, New york, USA, (Jul. 21, 1997), 56-61 pgs.

Randolph, S., et al., "Focused electron-beam-induced etching of silicon dioxide", Journal of Applied Physics, American Institute of Physics, 98, (Aug. 3, 2005), 34902-34902.

Sanchez, E. J, et al., "Ion and electron beam assisted growth of nanometric sl m on structures for near-field microscopy", Review of scientific instruments, AIP, Melville, NY, US, vol. 73, No. 11, (Nov. 2002), 3901-3907 pgs.

Teo, K., et al., "Fabrication and Electrical Characteristics of carbon nanotube-based microcathodes for use in a parallel elecron-beam lithography system", Journal of Vacuum Science & Technology B: Microelectronics Processing and Phenomena, vol. 21, (Mar. 2003), 693-697.

Wang, J, et al., "Etching characteristics of chromium thin films by an electron beam induced surface reaction", Semicond. Sci. Technol., 18, (2003), 199-205.

Wood, L., "Plasma Cleaning of Chip Scale Packages for Improvement of Wire Bond Strength", IEEE, International Symposium on Electronic Materials and Packaging, (2000), 406-408.

"Taiwanese Application Serial No. 096124493, Office Action mailed Jan. 14, 2011", 14 pgs.

"Taiwanese Application Serial No. 096124493, Response filed Apr. 18, 2011 to Office Action mailed Jan. 14, 2011", 7 pgs.

Numajiri, T., et al., "Sample Preparation for electron beam testing with reactive ion etching", Proceedings of the 1997 6th International Symposium on Physical & Failure Analysis of Integrated Circuits, 1997, IEEE, (1997), 56-61.

Wood, L, et al., "Plasma Cleaning of Chip Scale Packages for Improvement of Wire Bond Strength", International Symp on Electronic Materials and Packaging, (2000), 407.

* cited by examiner

ELECTRON INDUCED CHEMICAL ETCHING AND DEPOSITION FOR LOCAL CIRCUIT REPAIR

RELATED APPLICATION

This application is a divisional of U.S. application Ser. No. 11/483,933 filed Jul. 10, 2006 now U.S. Pat. No. 7,807,062, which is incorporated herein by reference in its entirety.

TECHNICAL FIELD

This application relates generally to semiconductor devices and device testing and, more particularly, to local repair of electrical failures in integrated circuit (IC) devices, such as memory devices, logic devices and microprocessors.

BACKGROUND

The semiconductor device industry has a market driven need to reduce device failures at electrical test. Reduced device failures may result in increased IC fabrication yield and improved device operational lifetime. Increased IC fabrication yields may result in decreased IC prices, and improved market share.

It is well known to examine failed devices by means of electrical testing, optical microscopes, transmitting electron microscopes (TEM), scanning electron microscopes (SEM), and other methods. If, for example, a contamination particle is found that produces a short between two conductive lines in a signal layer, then action may be taken at the fabrication site to reduce particle levels, and thus increase fabrication yield. If a metal contact has been under etched and has thus produced an open circuit state, then action may be taken at the fabrication site to improve surface tension in wet chemical etches, or to increase the overetch time to help ensure that the contacts are properly opened.

It is known to remove the top layers of an IC device by means of what may be known as a spot etch, in which a small elastomeric ring formed of a chemically resistant material is pressed onto the surface of the IC in the area of the suspected defect and serves to hold an etching solution designed to remove some or all of the top layers of the structure and expose the defect. However, the size of the elastomeric ring is very large as compared to the dimensions of typical structures, such as ICs, and may be larger than 2 mm in diameter, and thus produces a relatively large hole in the IC device. In addition to the above noted issue of the size of the opened area of the circuit, there is no method to image the surface during the material removal process to determine if the etch position coincides with the suspected defect, or to determine when the etch has reached the desired location.

It is known to etch small diameter holes of several microns in diameter in IC surfaces by means of what may be known as ion milling, using focused ion beams of such heavy materials as gallium. It is possible to analyze the material being etched by means of examination of the atoms in the exhaust gas stream, typically using methods such as optical emission spectroscopy, atomic absorption spectroscopy, infrared spectroscopy, Raman spectroscopy, or mass spectroscopy. However, ion milling is not generally able to selectively etch certain types of materials, such as oxide over metal, with a reasonable etch ratio, as compared to the high selectivity available with the chemical spot etching discussed above, and it is difficult to determine when the vertical etch depth has reached the desired location.

In addition to the above noted problems with exposing a suspected defect location, there is no method to correct the defect so that the device can be retested to determine if the suspected defect was the sole problem with the IC. In addition to the ability to prove that the suspected defect was the cause of the failure, such an ability to repair an IC would also be useful in saving the lost value of high value ICs, such as fast microprocessors and radiation hardened logic chips.

What is needed is a method to chemically etch a small area of an IC with high selectivity between different materials, with the ability to then either etch away unwanted material, or to deposit a material to replace a missing section, and then repair the etched hole in the IC. The ability to observe the etching process and to end etching at the desired defect location as well as to analyze the etch reaction products may help to provide an accurate etch stop procedure. With such an arrangement, the IC may have the defect location easily found and exposed, the defect cured, and the part returned to operational condition.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present disclosed embodiments. Other embodiments may be utilized and structural, logical, and electrical changes may be made without departing from the scope of the present disclosure. The various embodiments are not necessarily mutually exclusive, as some embodiments can be combined with one or more other embodiments to form new embodiments.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present disclosure is defined only by the appended claims, along with the full scope of equivalents to which such claims are entitled.

The described arrangement provides a method for localized accelerated chemical etching and/or deposition of various materials, such as may be found in a typical integrated circuit (IC), and the ability to repair holes in dielectric materials, open defective contacts, remove oxides from conductors, and to deposit conductive materials to fill in gaps in metal lines. In an embodiment, the localized accelerator is an electron beam, and the excited material includes a halogen containing compound forming a layer on, or immediately above, the surface of the IC in a vacuum chamber, such as inside a scanning electron microscope (SEM). Localized electron beam assisted chemical etching provides a method of removing materials, such as incompletely etched metal filaments forming short circuits, improperly etched contacts, or an unblown fuse, to correct circuit operation. Localized electron beam assisted chemical deposition provides a method of adding materials, such as reconnecting a blown fuse or filling in a void in metal or dielectric layers, to correct circuit operation.

The method allows for selective and/or sequential etching of various layers, and may be compared to what is known in the semiconductor art as spot etching for failure repair or for electrical characterization. It is also possible to use the described method to selectively deposit materials locally, for example, in the etched hole to return the IC to operational condition. For example, a one micron diameter hole may be etched through several different material layers of an IC chip, and an undesired metal particle (perhaps shorting two signal lines together) may be selectively etched away, perhaps by using chlorine containing reactive materials. The hole may then be filled with a dielectric material using the electron beam method to create radicals of silane and oxygen to form a silicon oxide dielectric layer in the hole. The "repaired" device may then be removed from the system and electrically function tested to determine if the undesired particle was the sole cause of the observed failure.

Forming the reactive radicals may occur in an illustrative embodiment by passing a gas phase halogen containing material over the surface of the IC chip in the vacuum chamber, and exciting the halogen atoms with an electron beam to form chemical radicals to etch an area of the dielectric layer to expose the defect. By controlling the vacuum pressure and the gas flow, the mean free diffusion length of the radicals may be controlled, and the etching of the IC surface may be confined to a desired region around the electron beam. Electrons from the primary beam, electrons scattered from the IC surface, as well as secondary electrons from the IC surface may all cause the formation of the halogen radicals by dissociating the individual atoms of the halogen containing layer. The halogen containing layer may be adsorbed onto the surface of the IC, as may occur when using a base material such as xenon difluoride, which sublimates in a vacuum and may deposit on the surface of the IC.

The etching method describe may be used to remove material in an area of the IC to look for particles, image errors, metal bridging, foreign materials, voids and holes. For example, it is possible to use the method to remove a dielectric layer, remove a metal layer, and determine if a contact was properly opened. If the contact has a defect inducing layer of dielectric under the removed metal layer, the method may be used to remove this dielectric and repair the contact, by redeposition of the metal layer and the top dielectric layer, returning the circuit to operation.

Figure 1:
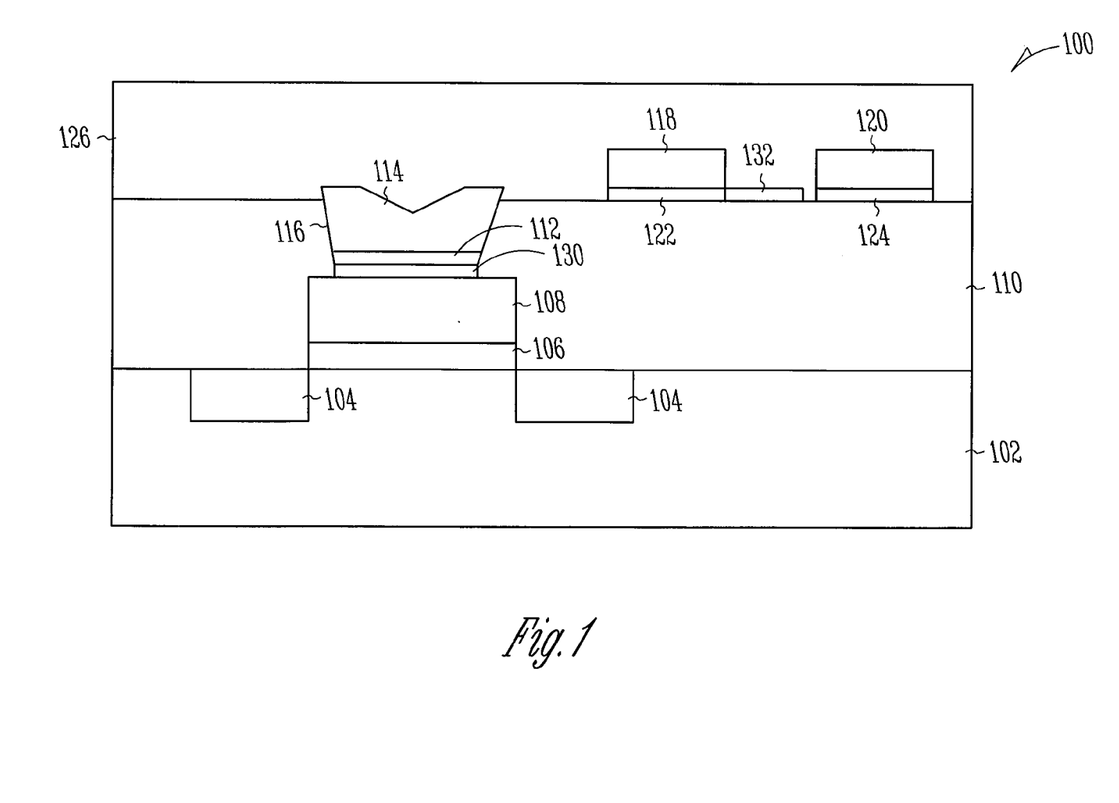
FIG. 1 illustrates a semiconductor device having defects shown in cross section.

FIG. 1 illustrates a semiconductor device 100, having a substrate 102, with two diffused regions 104. The diffused regions form the source and drain of a transistor having a gate dielectric 106, and a gate electrode 108, which in combination with an electrical signal, may cause an electrically conductive channel to appear in the substrate 102 between the source and drain electrodes 104, forming a metal oxide semiconductor (MOS) transistor. The transistor controlled by the gate electrode 108, is protected from unwanted external electrical signals by the dielectric protection layer 110, which has a contact structure 116 allowing the desired electrical signal carried on conductive materials 112 and 114 to access the gate electrode 108. Typically, the conductive material 112 may be a barrier layer such as titanium tungsten under the more conductive copper of 114. The source and drain diffusion regions 104 will also have contact to a conductive material at some location, to provide the signal or bias required to have the transistor operate in the desired fashion. The contacts to the source and drain are not shown to simplify the figure. There are other conductive material lines such as lines 118 and 120, each having a barrier layer 122 and 124 underneath in accordance with the illustrative embodiment discussed with reference to the 112 and 114. The conductive lines 118 and 120 may typically be used to connect various transistors to each other and to various input/output connections, but in this illustrative embodiment lines 118 and 120 are not intended to contact any portion of the shown transistor. The conductive material lines 114, 118 and 120 are protected from environmental problems such as scratches and ionic contamination by a dielectric layer 126.

The semiconductor device 100 is shown having a defect 130 under the conductor layer 112, that may represent a portion of the oxide 110 that was under etched when the contact 116 was opened. There is also a defect 132 shown that may electrically bridge the gap between the metal conductors 118 and 120, thus causing a potential electrical leakage path or short. The defect may represent an un-removed portion of the conductive layer that formed 122 and 124, due to under etch, design error, photo masking error, or a particle that fell on the device during manufacture. The defect 132 is not shown as being a complete short circuit, but still may cause a large enough electrical leakage path that the device may fail.

Figure 2:
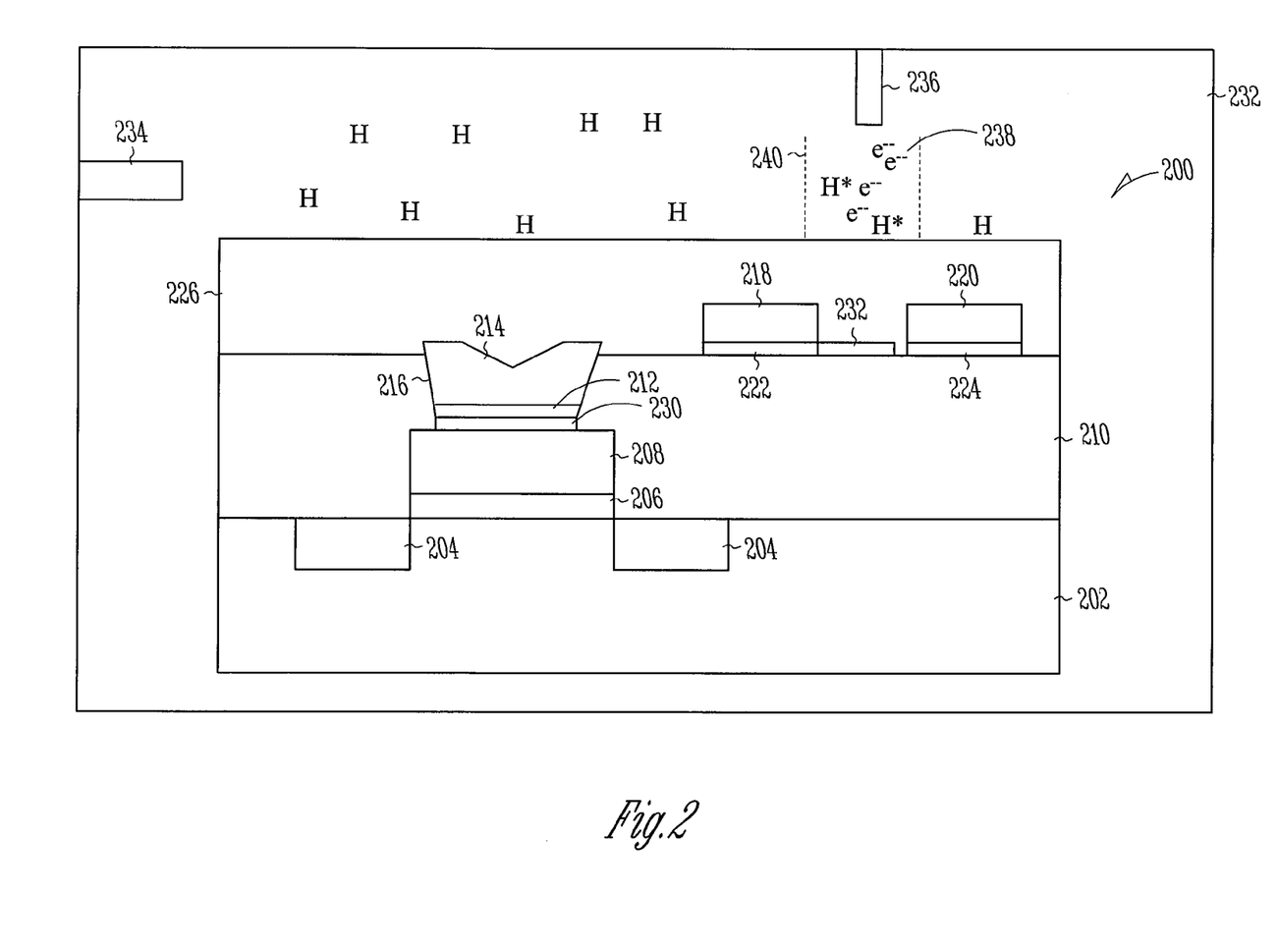
FIG. 2 illustrates the semiconductor device of FIG. 1 in a vacuum chamber in accordance with an illustrative embodiment.

FIG. 2 illustrates the semiconductor device of FIG. 1 in a vacuum chamber 232, in an embodiment, a SEM, having a vacuum pump (not shown for simplicity), an inlet 234, and an energetic beam 236, such as an electron beam. Similar features in FIG. 2 have similar numbers to the equivalent feature in FIG. 1. The inlet 234 may be a directed gas jet as shown, or a sublimation port, a gas shower head, or a liquid material sprayer, such as an atomizer. The inlet 234 supplies the region around the top surface of the sample with a material that is either reactive, or may be made reactive, such as a halogen containing material. The atoms of the halogen in this illustrative example are shown as floating "H" symbols, some of which are adsorbed onto the surface of the sample, and some diffusing around the chamber 232.

The vacuum chamber 232 has a directed and focused energetic beam device 236, which in an embodiment is a SEM beam, directed to a desired location on the surface of the sample, where a failure is believed to exist, in this embodiment the leakage path 232. The electron beam device 236 emits electrons 238 (shown as "e⁻" symbols) which excite the halogen molecules or atoms (H) floating in the vacuum chamber 232, or adsorbed onto the surface of the sample, and form a chemically reactive radical, denoted by "H*", which due to the limited lifetime of radicals, are limited to the area around the electron beam 236 shown by the dotted lines 240. The selected radicals H* have a much greater chemical etch rate on the dielectric layer 226, than the halogen molecules or atoms (H). In an illustrative embodiment, the halogen compound is xenon difluoride, which forms fluorine radicals when excited by the electron beam. The fluorine radicals have a large etch rate on dielectric layer 226, but do not rapidly etch conductive materials such as 218 and 220, which may for example be formed of aluminum, copper or tungsten. In this illustrative example, the etching is said to be selective for dielectrics over conductive materials.

When the etched hole in the dielectric reaches the leakage path 232, the etch products will change, since the amount of dielectric being etched in a given time period will be reduced due to the bottom of the etch hole being formed of whatever metal comprises 232, for example titanium tungsten. Thus, a down stream analysis system such as a residual gas analyzer, may note the reduction in silicon containing compounds, and serve as an endpoint detector. The etch may also be terminated by direct observation using the SEM itself, or the analytic tools found in many SEMs.

At this point, the reactive material injected by port 234 may be changed from a fluorine containing material to a chlorine containing material and thus to etch away the defect 232 while reducing the etch rate of the dielectric 226. The proper choice of chemical to use in forming the radicals depends upon the material of the defect 232 in conjunction with the material of the conductors 218 and 220, and may be easily determined by reference to known chemical etch rates of materials. After the defect 232 is completely removed, which may again be determined by etch product analysis, or by direct observation using a SEM, the material injected by port 234 may again change to a silicon containing compound, along with an oxidizer and/or ammonia, to form a silicon dioxide, or silicon nitride layer to fill the hole etched in the dielectric 226. In such a fashion, the defect 232 has been exposed, removed, and the device returned to operational condition.

Figure 3:
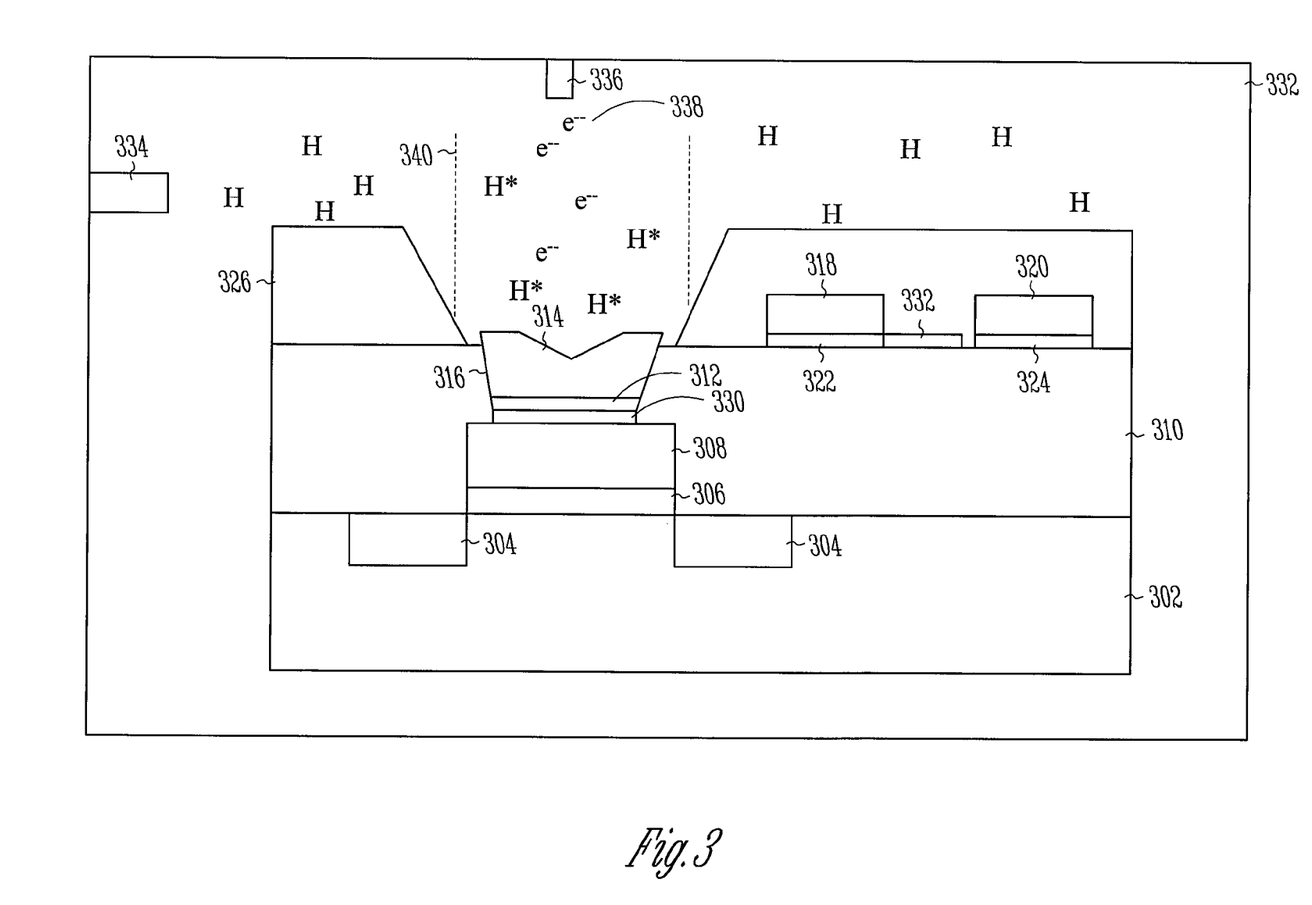
FIG. 3 illustrates the device of FIG. 1, after a period of etching has occurred in another illustrative embodiment.

FIG. 3 illustrates the semiconductor device of FIG. 1, after a period of etching of the dielectric layer 326 has occurred in the fashion discussed with reference to FIG. 2, to partially expose the other illustrative defect 330, under the conductor 312. Since the illustrative area of the defect 330 is larger than that of the defect 332 discussed in connection with FIG. 2, the energetic beam, in an embodiment, an electron beam of a SEM, has been either defocused or scanned over the area represented by the dotted lines 340. In an embodiment, the scanned electron beam may be used to form etch holes or depositions in essentially any possible scan able shape, for example in the shape of a comb to open up a large input/output inter-digitated MOS transistor source/drain connection, or gate electrode At the illustrated point in the opening of the defect 330, the dielectric etch is completed and the etching of the conductive materials 324 and 312, illustratively aluminum and tungsten respectively. The material injected by port 334 may be changed from a fluorine containing halogen to a chlorine containing halogen compound to change the relative etch rates of the conductive materials versus the dielectric 326. In addition, the energy and current rate of the energetic beam device 336 may be changed to select a desired etch rate and selectivity.

Figure 4:
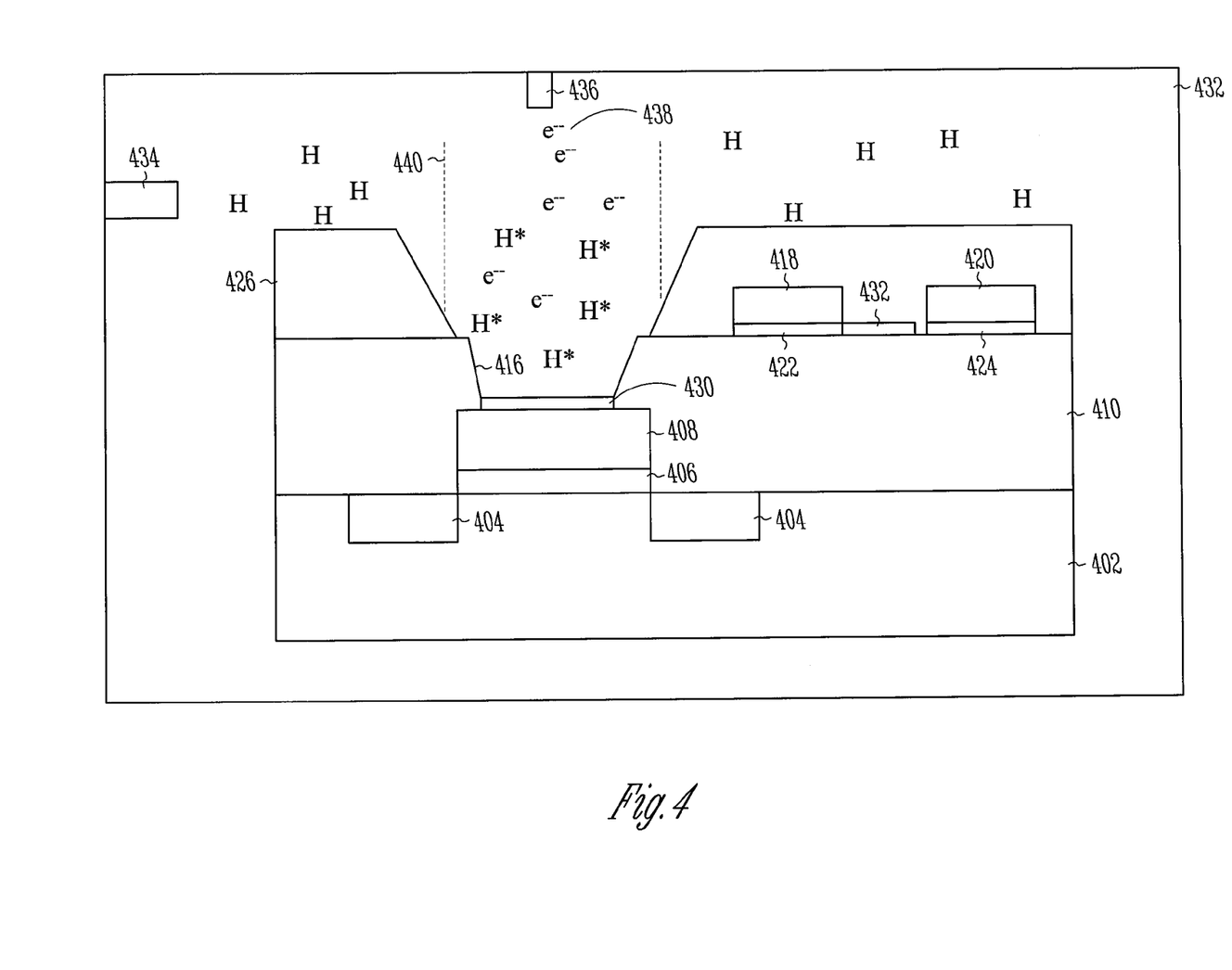
FIG. 4 illustrates the device of FIG. 3, after an additional period of etching has occurred.

FIG. 4 illustrates the device of FIG. 3 at a point in the process when the conductive materials have been removed, and the defect 430, illustratively an incompletely etched portion of the dielectric 410 that remained in the contact 416, perhaps due to a photolithographic error, a wetting problem in a wet chemical etch process, or oxidation of the material of the gate electrode 408. At this point, the material injected by port 434 may change again, or other etch conditions may be adjusted to change from the conductive material etch processes used to remove conductive layers 314 and 312, to an etch ambient to produce a radical to remove the material 430 and thus repair the contact. The choice of proper ambient may be determined by an analysis of the material properties of the material 430, by direct SEM analysis, such as EDAX, or by down stream analysis such as residual gas analysis (RGA).

After the defect 430 is removed, the reactive material injected by port 434 may change to a deposition ambient, for example using tungsten hexafluoride. The reactive material is disassociated into radicals by the energetic beam from 436 and the lower portion of the contact 416 may be filled with tungsten. Then material injected by port 434 may be changed to aluminum fluoride, which may be disassociated by the energetic beam and fill the remainder of the contact 416 with aluminum. Finally, the material injected and excited may be changed to a silicon containing compound with either or both of an oxidizer like oxygen and ammonia or other nitriding material, to form a dielectric layer compatible with the dielectric layer 426. In such a fashion, the defect 430 may be removed and the device repaired and returned to testable and operational condition.

Figure 5:
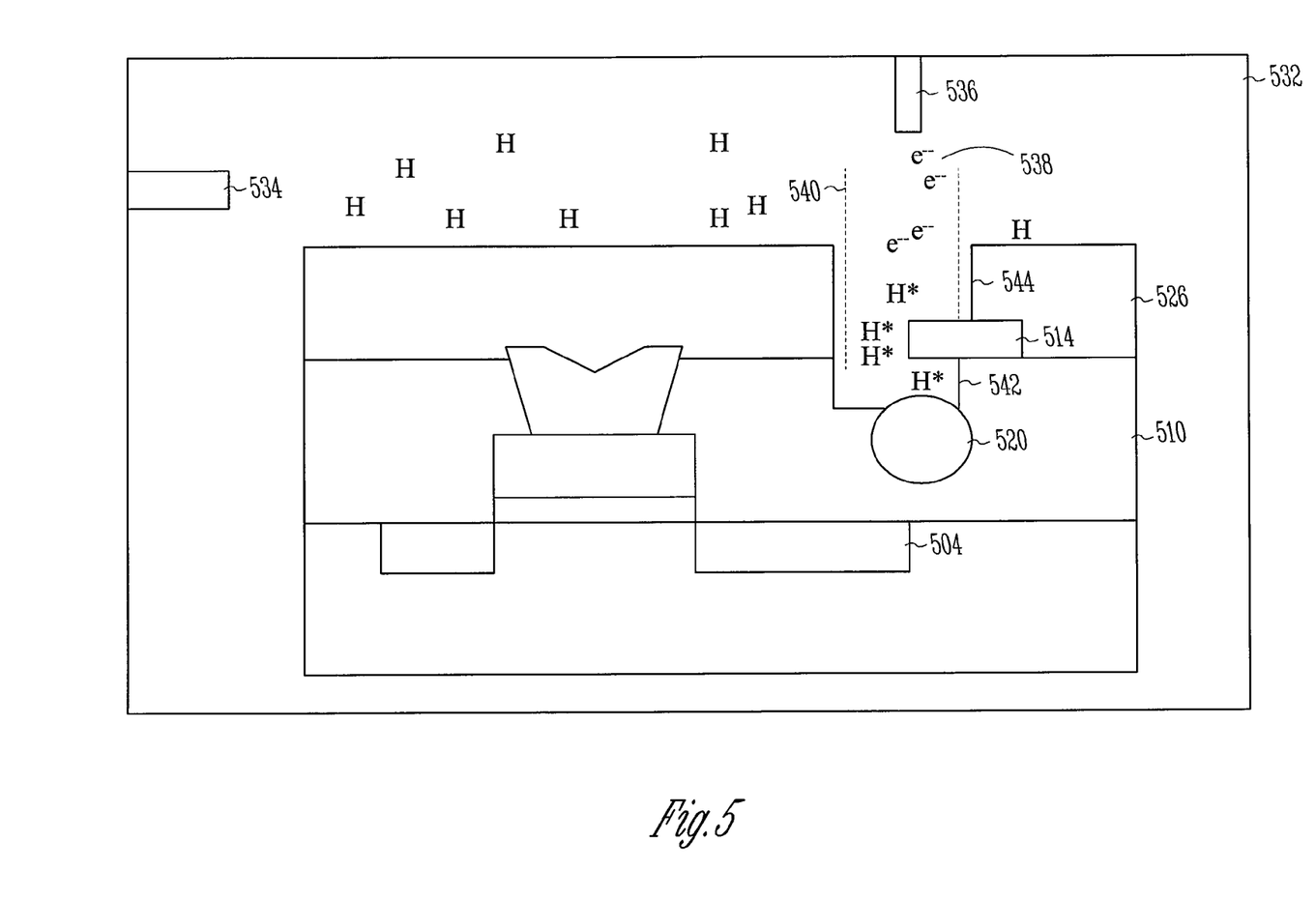
FIG. 5 illustrates another semiconductor device having a different defect in accordance with another illustrative embodiment.

FIG. 5 illustrates a different integrated circuit shown in cross section, having a void 520 in a dielectric layer 510. In this illustrative embodiment, the material injected by port 534 is a halogen containing material, in an embodiment, a fluorine containing material, that etches a hole with selectivity for dielectrics, such as 526 and 510, over the conductive material in a line 514. In this illustrative embodiment, the dielectrics are etched in a similar fashion to those discussed above with reference to the embodiments of FIGS. 2, 3 and 4. It may be seen that since the etch is selective to dielectric materials, the conductive material 514 is undercut. Even though the halogen radicals can easily enter the region under the conductive material 514, the increased flow distance and the limited lifetime of radical species results in the edge 544 of the etch area in the region above the conductive material 514 being further from the center of the energetic beam from 536 than is the edge 542 of the etch area in the region below conductor 514. This difference may be controlled by adjusting the vacuum pressure and other ambient conditions affecting the radical lifetime.

After the void 520 has been exposed, the method may change the reactive material composition injected by port 534 to a deposition ambient as discussed above with reference to the illustrative embodiment of FIG. 4. Typically, a silicon containing material such as silane, dichlorosilane or trichlorosilane is mixed with an oxidizing material such as water vapor, hydrogen peroxide, or oxygen, or with a nitrogen containing material such as ammonia or nitrous oxide, or with any combination of these materials, to form a dielectric layer and fill the etched hole. In such a fashion it is possible to fill the void 520, and repair the device.

Figure 6:
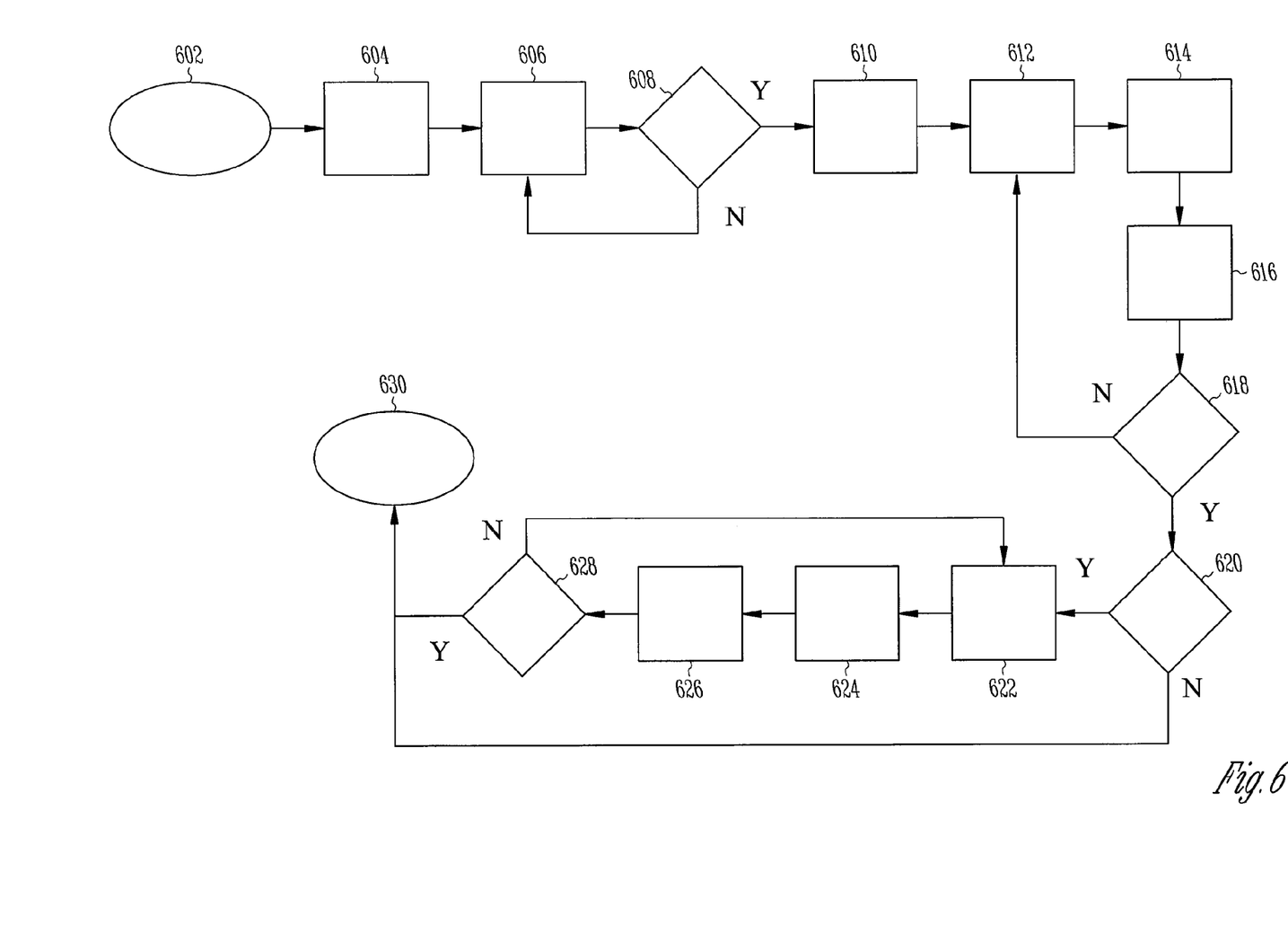
FIG. 6 is a flowchart of the method in accordance with an illustrative embodiment.

FIG. 6 is a flow diagram showing the method for electron induced chemical etching and deposition for circuit repair. The method starts at 602 with obtaining a sample, such as a defective IC, for repair. At 604, the sample is placed in a vacuum chamber, such as a SEM, and the chamber begins to be evacuated at 606. At 608 it is decided whether or not the chamber has been pumped to a desired vacuum pressure, which may be used to control the mean free path of the radicals generated by the electron beam. If the desired pressure is not yet obtained, the method returns to 606. When the proper vacuum level is reached, the method uses a beam locator device, such as a SEM, to find the desired location at 610. At 612, the reactive material is injected into the vacuum chamber at a controlled rate, which in conjunction with the control of the vacuum pressure and the beam energy and intensity, may determine the production rate of the chemical radicals. The electron beam is turned on at a desired energy and beam intensity at 614, which depending upon the selected reactive material composition and pressure begins the chemical etching or the deposition of some portion of the sample surface towards which the electron beam is directed. The reaction products are removed by the vacuum system.

At 616, the results of the etching or deposition reaction is examined by either imaging the region with the SEM, or by analyzing the reaction products by a down stream analytic method, such as RGA. The surface may also be directly examined during this step by imaging the etch region with a SEM and using SEM based analysis methods, such as EDAX. At 618, it is determined whether the current material has been completely etched or deposited, and whether the defect has been exposed and repaired. There may be several different processes to completely expose and repair a defect, and thus the process may return to 612 with a different reactive material combination.

If the current layer etching or deposition has been completed and there is no further layer to etch or deposit to repair the defect, then it is determined at 620 if there is an additional layer that needs to be deposited to fill the hole etched to expose the defect, or whether there is to be a localized deposition done to fill the etched hole. If the device is going to go to test and not returned to operational status, then there may be no purpose in filling the hole, and the method ends at 630.

If the hole is to be filled to return the repaired device to operational status, then another process, typically a conductor or a dielectric deposition, is needed to complete the method. At 622, a new reactive material may be injected into the vacuum chamber, where the material injected depends upon the dielectric to deposit. The electron beam is turned on to the desired energy level and intensity at 624, and the deposition byproducts may be analyzed at 626 for unexpected materials. At 628 it is determined if the present layer has been fully deposited to the desired level, typically by examining the hole by SEM imaging. If not, the method returns to 622. If the deposition layer is completed, the method ends at 630. Clearly, the method to be used if there is a second layer of dielectric or conductor to fill, is a repetition of the steps from 622 to 628, until all the desired layers are filled.

Figures 7, 8:
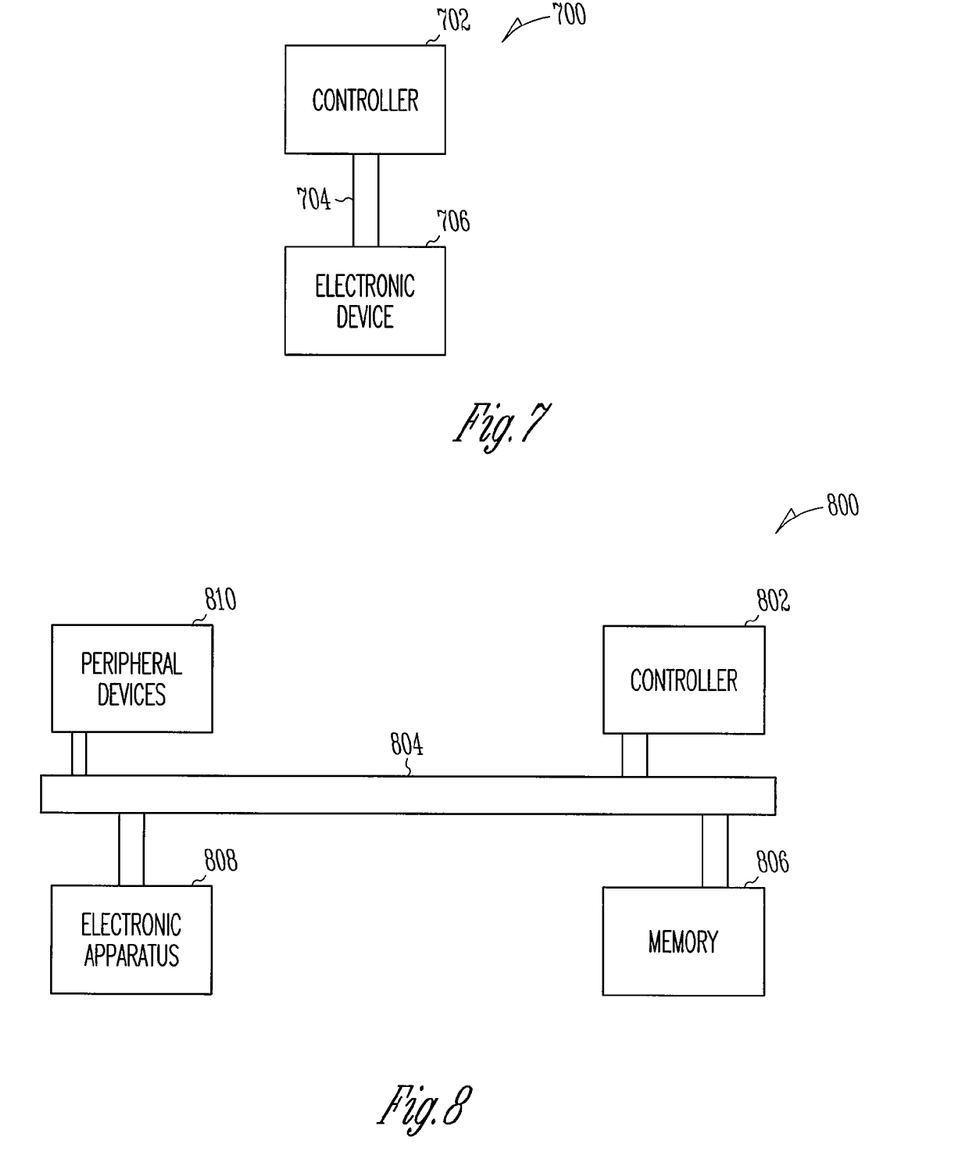
FIG. 7 is a block diagram of an electronic device in accordance with an embodiment of the invention.
FIG. 8 is a diagram of an electronic system having devices in accordance with an embodiment of the invention.

FIG. 7 is a block diagram of a general electronic device in accordance with an embodiment of the invention with an electronic system 700 having one or more devices failure analyzed and repaired according to various embodiments of the present invention. Electronic system 700 includes a controller 702, a bus 704, and an electronic device 706, where bus 704 provides electrical conductivity between controller 702 and electronic device 706. In various embodiments, controller 702 and/or electronic device 706 include an embodiment for a portion of the device having an IC die repaired as previously discussed herein. Electronic system 700 may include, but is not limited to, information handling devices, wireless systems, telecommunication systems, fiber optic systems, electro-optic systems, and computers.

FIG. 8 depicts a diagram of an embodiment of a system 800 having a controller 802 and a memory 806. Controller 802 and/or memory 806 include a portion of the circuit having IC devices and memory chips repaired in accordance with the disclosed embodiments. System 800 also includes an electronic apparatus 808, and a bus 804, where bus 804 may provide electrical conductivity and data transmission between controller 802 and electronic apparatus 808, and between controller 802 and memory 806. Bus 804 may include an address, a data bus, and a control bus, each independently configured. Bus 804 also uses common conductive lines for providing address, data, and/or control, the use of which may be regulated by controller 802. In an embodiment, electronic apparatus 808 includes additional memory devices configured similarly to memory 806. An embodiment includes an additional peripheral device or devices 810 coupled to bus 804. In an embodiment, controller 802 is a processor. Any of controller 802, memory 806, bus 804, electronic apparatus 808, and peripheral device or devices 810 may include ICs treated in accordance with the disclosed embodiments. System 800 may include, but is not limited to, information handling devices, telecommunication systems, and computers. Peripheral devices 810 may include displays, additional memory, or other control devices operating with controller 802 and/or memory 806.

CONCLUSION

A method is presented of repairing a circuit, such as an IC, by positioning a circuit in a vacuum chamber, creating a layer of reactive material in proximity to the surface of the circuit, and exciting the layer of reactive materials to form chemical radicals by using an energetic beam, such as an electron beam from a scanning electron microscope (SEM). The radicals will etch the surface to expose the defect, which is then either etched to remove a defective portion of the circuit, or a material is deposited to fill in a defective portion of the circuit. Finally, the hole is filled by depositing material to replace the removed portion of the surface of circuit.

Typically, the reactive material comprises a halogen in gaseous, liquid or solid form to etch various IC materials. In an embodiment, the reactive material is xenon fluoride, which is a solid at standard temperature and pressure, and sublimes in the vacuum chamber. Fluorine containing materials will typically be used to etch dielectric materials, and chlorine containing materials may be used to etch metals. The reactive material may comprise a metallo-halide in gaseous, liquid or solid form to deposit conductive layers. An illustrative embodiment is tungsten hexafluoride for tungsten deposition. The reactive material may comprise a mixture of a silicon containing compound, such as silane or TEOS, with an oxidizing material, such as oxygen, to form dielectric layers such as silicon dioxide. Reactive combinations such as dichlorsilane and ammonia may be used to deposit silicon nitride layers.

The reactive material may be directed to the region near the surface of the IC chip by a formed jet of vapor, or may simply be allowed to diffuse through the vacuum chamber. The reactive material may be adsorbed onto the surface of the material, may be a gas in the vicinity of the surface, or may condense or precipitate onto the surface. The reactive material may be a mixture of materials (that is chemical precursors) which react with one another, especially when activated or excited to form chemical radicals, and may include a material that does not directly interact with the other reactive materials, but rather acts as a reaction catalyst, an inhibitor, promoter, or reaction buffer. The chemical radicals may form a chemical etching environment that may selectively remove one component of the material to be characterized, and the precursor reactive materials may be changed as the process continues and as different materials are uncovered on the IC.

The method of exciting the layer of reactive materials may use an energetic beam such as an electron beam. The electron beam may have a diameter of less than $0.1\mu$, or less than $0.01\mu$, or greater than $1.0\mu$, depending upon the size of the area that is to be analyzed. Preferably, the electron beam diameter is about $0.005\mu$. The electron beam may have a lower energy to slow the etch rate to a rate easier to control, may have a reduced dwell time in the etch area, or may be defocused to etch a wider area as the circumstances require. If the energy density of the electron beam is not sufficient when defocused to create enough chemical radicals, then the electron beam may be scanned to cover the desired etch area and etch shape. The etch areas may be made as small as the electron beam can be focused, plus the mean free path of the generated chemical radicals, and may be less than a diameter of 1.0μ. The electron beam may be part of a scanning electron microscope (SEM), and the SEM may be used to provide an image of the process as etching occurs.

The surface material removed by the chemical radicals may be used to provide an endpoint detection capability for etch processes. The removed material may be analyzed by many well known analytical methods, including downstream analysis systems such as residual gas analyzer (RGA), mass spectroscopy (quadra-pole or magnetic), optical emission spectroscopy, atomic absorption spectroscopy, infrared spectroscopy, Raman spectroscopy, and direct spot analysis of the surface by energy dispersive analysis of X-rays (EDAX), XES, or other SEM based analytic methods.

Another illustrative embodiment of the invention includes a system for repairing a circuit having a vacuum chamber, a first gas inlet for creating a layer of a selected chemical combination in proximity with the surface of the sample, a first energetic beam directed at a selected location on the surface of the integrated circuit with sufficient energy to form chemical radicals from the selected chemical combination, and a device for examining material removed from the surface of the sample to determine when a defect location has been exposed. The defect may be repaired by etching away a portion of the circuit, or by depositing a material to fill in a missing part of the circuit using a second gas inlet (which may be the same as the first gas inlet) to create a layer of a second chemical combination in proximity with the surface, and using a second energetic beam (which may be the same as the first energetic beam, and may be an electron beam) with sufficient energy to form chemical radicals from the second chemical combination. When the defect has been etched and/or filled in to repair it, then the etched hole is filled in by a local deposition. The vacuum chamber and energetic beam, as well as the analytic device may be a SEM.

The described embodiments are directed towards the use of an electron beam to activate an adsorbed material forming a layer on an IC chip, and forming chemical radicals to either etch the surface material of the IC or to deposit material on the IC, but the embodiments are not so limited, and may be applied to other structures and devices, such as printed circuit boards (PCBs), multi-chip modules (MCMs), liquid crystal display (LCD) devices, electronic displays, microelectro-mechanical devices (MEMs), or other manufactured electronic or mechanical devices requiring local circuit repair. Other means of forming local chemical radicals other than electron beams are included in this disclosure, to include focused microwave beams, laser and maser beams, X-ray and other energetic radiation sources. The material used to form the chemical radicals may be a gas, an evaporated liquid, a sublimed solid, or may be chemically formed by mixing precursor materials at the surface of the structure to be analyzed, or mixed remotely from the surface and either passively or actively transported to the region around the surface of the IC, or other structure. The reactive material may be either adsorbed onto the surface, precipitated onto the surface, or form a fluid layer in proximity to the surface, including a gaseous layer in the region around the IC surface. The generated chemical radicals may be used to selectively etch the surface as described in the described embodiments, or may react with other provided, or already present materials, to form dielectric, conductive or other materials to become a local deposition reaction. Such depositions may be used for example, to repair an open circuit in a conductive line, to add dielectric material to a void defect, or to program a circuit by blowing fuses or connecting conductive lines, as well as refilling the previously etched region to return the IC or other structure to a working condition.

Although specific embodiments have been illustrated and described herein, it will be appreciated by those of ordinary skill in the art that any arrangement that is calculated to achieve the same purpose may be substituted for the specific embodiments disclosed, described and shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present disclosure includes any other applications in which embodiments of the above structures and fabrication methods are used. The scope of the embodiments of the present invention should be determined with reference to the appended claims, along with the full scope of equivalents to which such claims are entitled.

What is claimed is:

1. A system for repairing an integrated circuit, comprising:
   a vacuum chamber;
   a first gas inlet in the vacuum chamber arranged to introduce one or more gases to create a layer of a selected chemical combination in proximity with a surface of the integrated circuit;
   a first source of an energetic beam, the source arranged to direct the energetic beam to a selected location on the surface of the integrated circuit with sufficient energy to form chemical radicals from at least one component of the selected chemical combination;
   an analysis device operable to examine material removed from below the surface of the integrated circuit and to determine when a defect location has been exposed, the analysis device operable to make a choice of an ambient to further control repair of the integrated circuit based on the examined material;
   a second gas inlet in the vacuum chamber arranged to introduce material to create a second layer of a second chemical combination in proximity with the surface of the integrated circuit; and
   a second source of an energetic beam with sufficient energy to form chemical radicals from at least one component of the second chemical combination such that a material deposition is conducted at the defect location by the energetic beam of the second source to repair a defect at the defect location below the surface.

2. The system of claim 1, wherein the first and second sources of energetic beams include a source of an electron beam.

3. The system of claim 2, wherein the source of the electron beam is a portion of a scanning electron microscope.

4. The system of claim 3, wherein the scanning electron microscope is disposed to provide images of the selected location during the formation of chemical radicals.

5. The system of claim 1, wherein the selected chemical combination comprises a halogen containing compound.

6. The system of claim 1, wherein the first and second gas inlets include a directed gas jet, a gaseous diffusion head, a sublimation device, a bubbler, or a liquid spray device.

7. The system of claim 1, wherein the analysis device is operable to determine completion of one or both of an etching activity or a deposition activity.

8. A system for repairing an integrated circuit, comprising:
a vacuum chamber;
a gas inlet in the vacuum chamber arranged to introduce a gas to create a layer of a chemical combination in proximity with a surface of the integrated circuit;
a source of an energetic beam, the source arranged to direct the energetic beam to a selected location on the surface of the integrated circuit with sufficient energy to form chemical radicals from the chemical combination;
an analysis device operable to examine material removed from below the surface of the integrated circuit by the energetic beam and to determine when a defect location has been exposed, the analysis device operable to make a choice of an ambient to further control repair of the integrated circuit based on the examined material;
a source of material such that a material deposition is operably conducted at the defect location by interaction of the material with the energetic beam of the source to repair a defect at the defect location below the surface.

9. The system of claim 8, wherein the source of the energetic beam includes a source configured to provide at least one of an electron beam, an ion beam, a laser beam, a microwave beam, or a X-ray beam.

10. The system of claim 8, wherein the analysis device includes a residual gas analyzer.

11. The system of claim 8, wherein the analysis device includes one or more apparatus configured to perform mass spectroscopy, optical emission spectroscopy, atomic absorption spectroscopy, infrared spectroscopy, Raman spectroscopy, energy dispersive analysis of X-rays, or X-ray emission spectroscopy.

12. The system of claim 8, wherein the analysis device includes apparatus to conduct SEM based analysis.

13. The system of claim 8, wherein the source of the energetic beam includes a source of an energetic beam such that the source is operable to selectively provide a defocused energetic beam.

14. The system of claim 8, wherein the source of the energetic beam includes a source of an energetic beam having an energy level, the source is operable to selectively adjust the energy level.

15. The system of claim 8, wherein the source of the energetic beam includes a source of an energetic beam such that the source is operable to scan the energetic beam in a direction along the surface of the integrated circuit.

16. The system of claim 8, wherein the system is operable to adjust ambient conditions in the vacuum chamber to affect a radical lifetime of the chemical radicals.

17. The system of claim 8, wherein the system is operable to adjust vacuum pressure in the vacuum chamber to control a mean free path of the chemical radicals.

18. The system of claim 8, wherein the analysis device is operable to determine completion of one or both of an etching activity or a deposition activity.

19. The system of claim 8, wherein the system is operable to image a region of the integrated circuit.

20. The system of claim 8, wherein the vacuum chamber and a source of the energetic beam are configured as a scanning electron microscope.

* * * * *